United States Patent
Schueller et al.

[11] Patent Number: 5,844,168
[45] Date of Patent: Dec. 1, 1998

[54] MULTI-LAYER INTERCONNECT SUTRUCTURE FOR BALL GRID ARRAYS

[75] Inventors: Randolph Dennis Schueller; John David Geissinger; Anthony Raymond Plepys; Howard Edwin Evans, all of Austin, Tex.

[73] Assignee: Minnesota Mining and Manufacturing Company, St. Paul, Minn.

[21] Appl. No.: 760,531

[22] Filed: Dec. 2, 1996

Related U.S. Application Data

[63] Continuation-in-part of Ser. No. 509,779, Aug. 1, 1995, Pat. No. 5,663,530.

[51] Int. Cl.$^6$ ............................................. H01L 23/02
[52] U.S. Cl. ..................... 174/52.4; 257/693; 257/779; 257/783
[58] Field of Search ................... 257/697, 698, 257/693, 699, 779, 780, 783, 786, 778, 774; 174/52.4

[56] References Cited

U.S. PATENT DOCUMENTS

| | | | |
|---|---|---|---|
| 4,859,806 | 8/1989 | Smith | 174/261 |
| 5,045,921 | 9/1991 | Lin et al. | 357/74 |
| 5,216,278 | 6/1993 | Lin et al. | 257/688 |
| 5,225,966 | 7/1993 | Basayanhally et al. | 361/406 |
| 5,285,352 | 2/1994 | Pastore et al. | 361/704 |
| 5,291,062 | 3/1994 | Higgins, III | 257/698 |
| 5,296,651 | 3/1994 | Gurrie et al. | 174/254 |
| 5,298,686 | 3/1994 | Bourdelaise et al. | 174/254 |
| 5,359,222 | 10/1994 | Okumoto et al. . | |
| 5,376,588 | 12/1994 | Pendse | 156/293 |
| 5,397,917 | 3/1995 | Ommen et al. | 257/698 |
| 5,397,921 | 3/1995 | Karnezos | 257/779 |
| 5,409,865 | 4/1995 | Karnezos | 29/827 |
| 5,450,283 | 9/1995 | Lin et al. | 361/704 |
| 5,473,194 | 12/1995 | Kawai et al. | 257/774 |
| 5,572,405 | 11/1996 | Wilson et al. | 361/705 |
| 5,578,796 | 11/1996 | Bratt et al. | 174/260 |

FOREIGN PATENT DOCUMENTS

| | | |
|---|---|---|
| 0 011 013 | 5/1980 | European Pat. Off. . |
| 04348097 | 12/1992 | Japan . |

OTHER PUBLICATIONS

Atsushi et al., "Semiconductor Device," Patent Abstract of Japan, Publication No. JP8064635, Mitsui Hihg Tec, Inc., Mar. 8, 1996.

Mamoru, "Semiconductor Device and Manufacture of Manufacture of Semiconductor Mounting Board," Patent Abstract of Japan, Publication No. JP8008352, Hitachi Cable Ltd., Jan. 12, 1996.

*Primary Examiner*—Bot Ledynh
*Assistant Examiner*—Hung V. Ngo
*Attorney, Agent, or Firm*—Matthew B. McNutt

[57] ABSTRACT

A ball grid array (BGA) package is provided in which the stiffener of the BGA may also be utilized as a conductive layer. A TAB tape is adhered to the stiffener by an adhesive and both the TAB tape and the adhesive may have vias which open to the stiffener. Conductive plugs which may be formed of solder paste, conductive adhesives, or the like may then be filled in the vias to provide electrical connection from the TAB tape to the stiffener. The vias may be located adjacent to solder ball locations. The TAB tape may include multiple conductor layers or multiple layers of single conductive layer TAB tape may be stacked upon each other to provide additional circuit routing. Further, the TAB tape layers may also be combined with the use of metal foil layers.

10 Claims, 9 Drawing Sheets

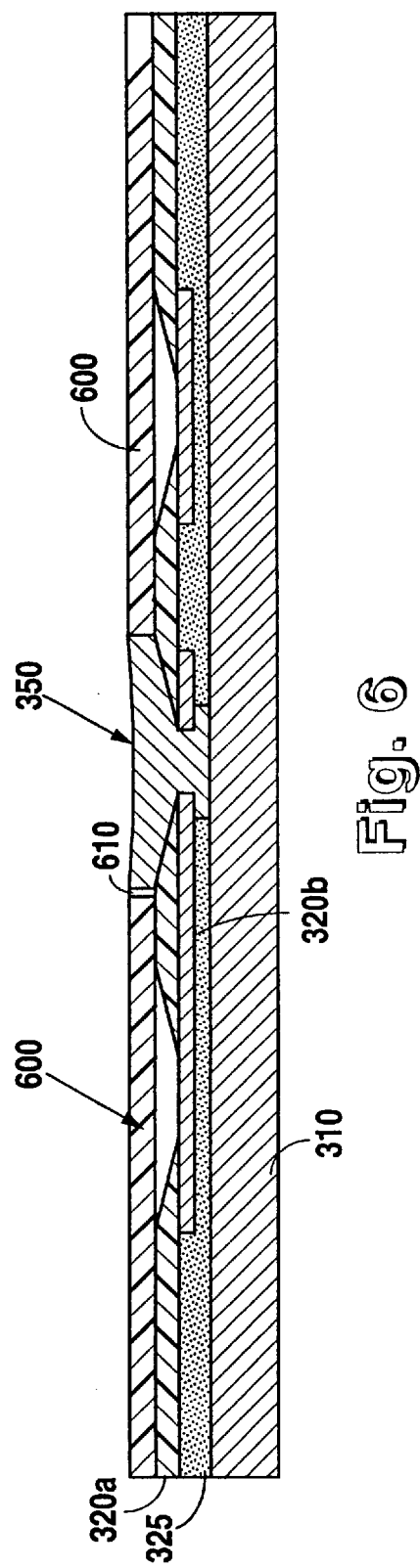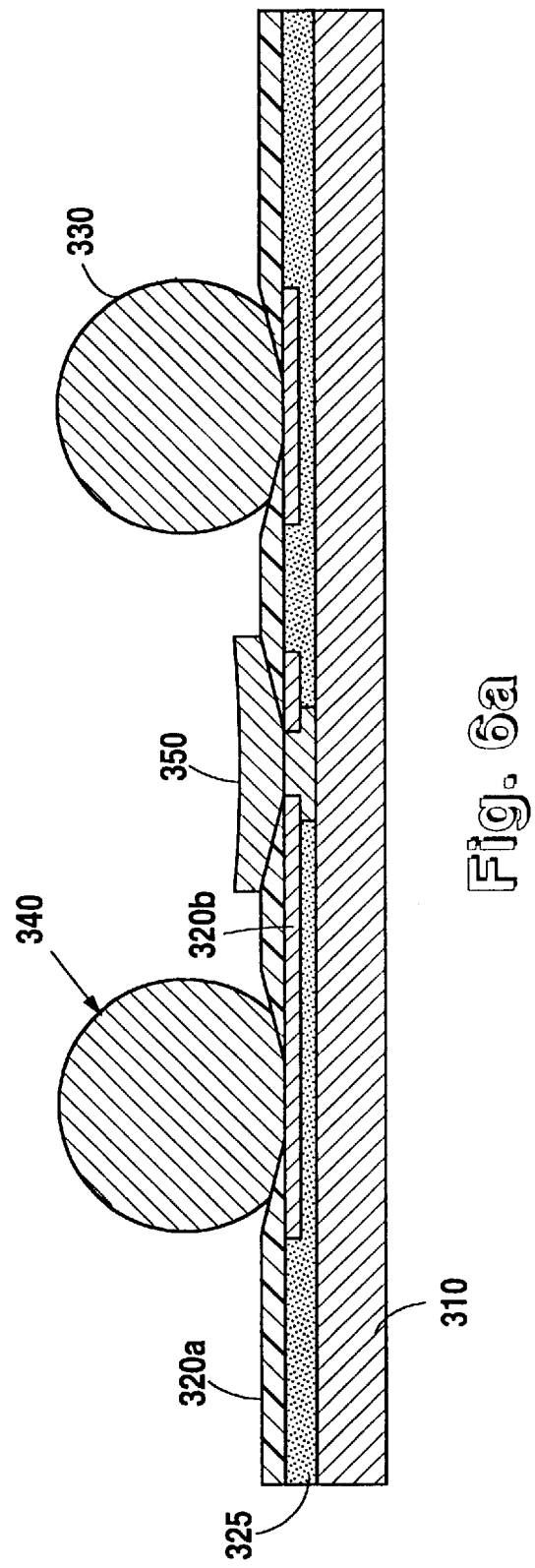

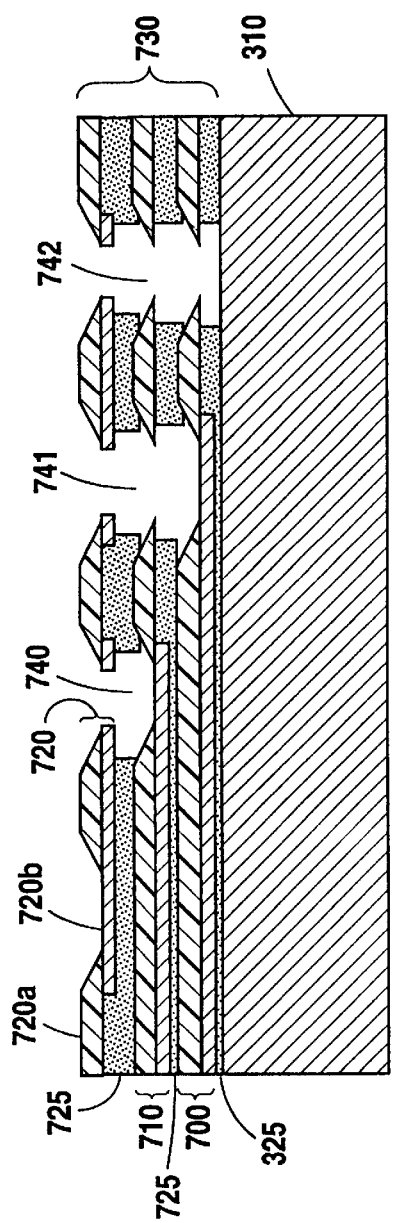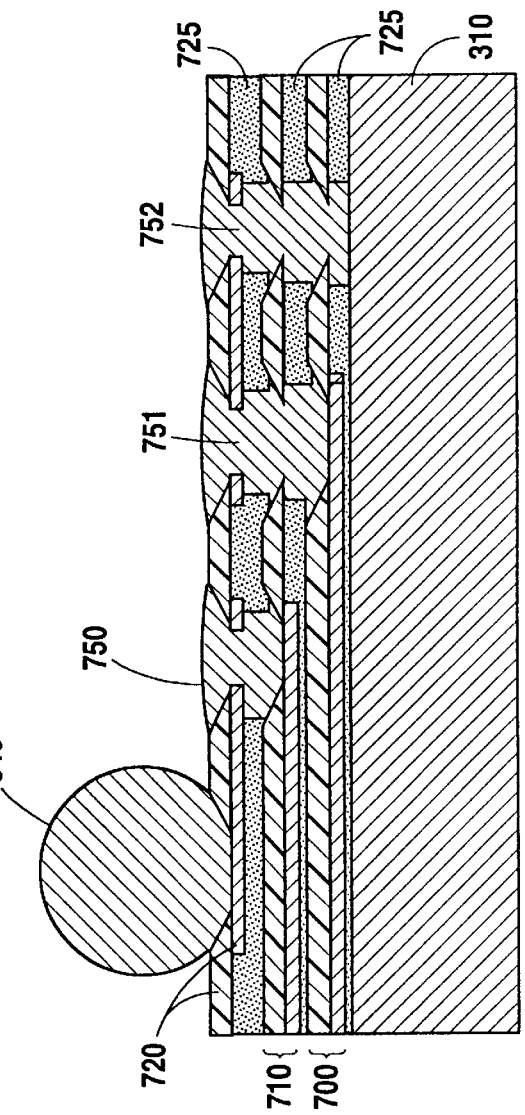

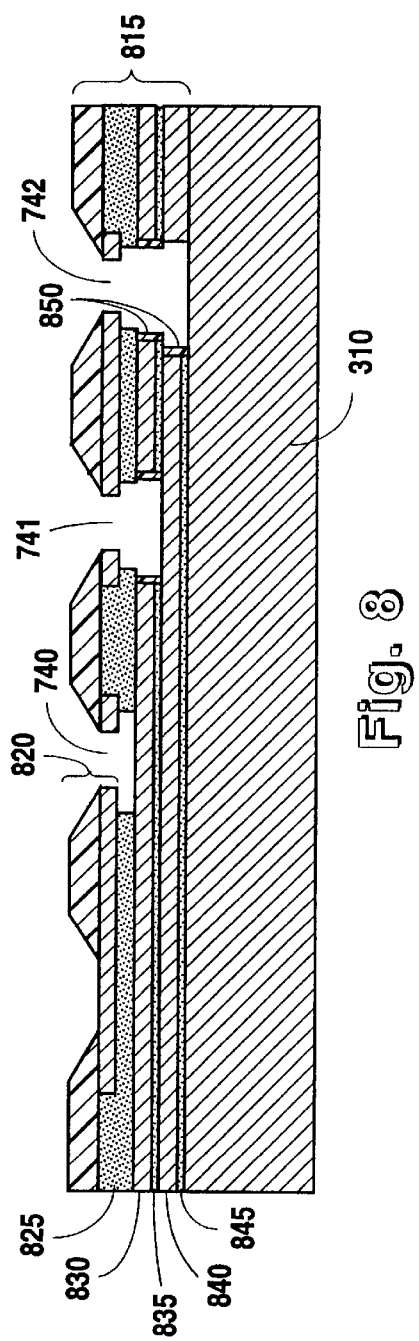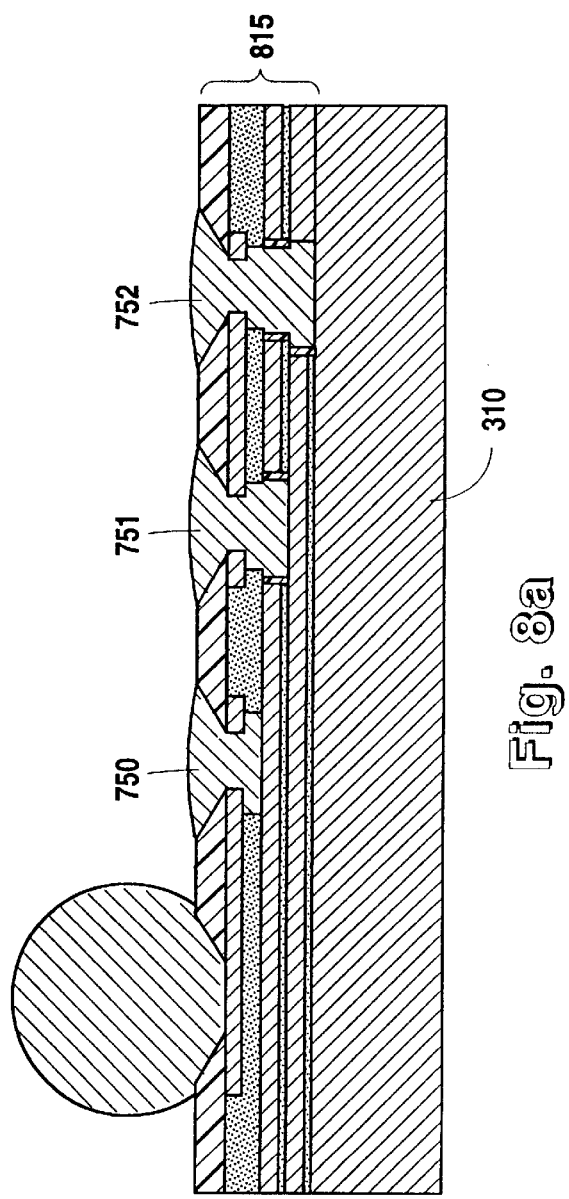

MULTI-LAYER INTERCONNECT SUTRUCTURE FOR BALL GRID ARRAYS

This application is a continuation-in-part of copending application Ser. No. 08/509,779, filed Aug. 1, 1995, Pat. No. 5,663,530, the disclosure of which is expressly incorporated herein by reference.

BACKGROUND OF THE INVENTION

The present invention relates to packages for integrated circuits and more particularly interconnection structures for multi-conductor layer packages.

A variety of packaging methods have been utilized for packaging integrated circuit die so that the die may be bonded to a substrate such as, for example, a printed circuit board. Typical packaging methods include the use of lead frames, TAB tape or ball grid arrays (BGA). The combination of a TAB tape and BGA package (TBGA packages) is also known. In such TBGA packages, a flexible circuit (for example a TAB tape) is adhered to a BGA stiffener or BGA substrate.

FIG. 1 illustrates one example of a prior art TBGA design. AS shown in FIG. 1, a TBGA package is provided having a stiffener 15 and a TAB tape 20. The TAB tape includes three separate layers, a dielectric layer 20a, a conductor layer 20b, and a dielectric layer 20c. The TAB tape is adhered to the stiffener 15 by a dielectric adhesive layer 25. An integrated circuit 30 is also adhered to the stiffener through the use of an adhesive. Solder balls 35 are provided through vias in the dielectric layer 20a of the TAB tape 20 so that connections may be made to the conductor traces of the conductor layer 20b. In some locations, vias are punched or etched through the TAB tape 20 and the adhesive layer 25 such as shown by vias 50. Solder balls 40 placed at these vias form a direct connection to the stiffener 15 during the solder ball reflow process. Because the stiffener 15 is an electrical conductor, a conductor layer in addition to the layers in the TAB tape is thus provided. Typically, the stiffener 15 would be utilized as a ground plane although it is possible that it may be utilized for other electrical purposes. A TBGA package similar to that shown in FIG. 1 may be seen in more detail in U.S. Pat. No. 5,397,921. The package shown in FIG. 1, however, has numerous disadvantages. For instance, the TAB tape utilized is a three-layer tape and it may be desirable to utilize a more cost efficient tape. Furthermore, because the solder balls 40 reflow down the via 50, the final height of the solder balls 40 may be unacceptably non-coplaner with the height of the solder balls 35. Also, since the solder ball which connects to the stiffener also connects to the final circuit board, thermal mismatched stress between the package and board will stress the solder connection to the stiffener increasing the likelihood of solder joint failure at said interface. In addition, because the solder balls 40 are placed directly upon the vias 50, an end user may only utilize solder balls 40 for electrical connections which are intended to be shorted to the stiffener, thus limiting the end user's circuit design flexibility. Finally, the reliability of the connection between the solder ball and the stiffener is highly dependent upon the solderability of the stiffener material.

FIG. 2 shows an alternative prior art TBGA package similar to that shown in U.S. Pat. No. 5,376,588. As shown in FIG. 2, the TBGA package 60 includes a stiffener 15 having a TAB tape 20 adhered to the stiffener with an adhesive 55. A chip 30 may also be adhered to the stiffener 15. Solder balls 35 are connected to the conductor layer 20b of the TAB tape 20. Solder balls 40 are also connected to the conductor layer 20b of the TAB tape. As shown in FIG. 2, vias 50 are formed in the dielectric layer 20a of the TAB tape in the regions where solder balls 40 are connected to the conductor layer 20b. In the design of FIG. 2, the adhesive layer 55 is a conductive adhesive layer. The adhesive layer 55 fills the vias 50 and contacts the conductor layer 20b. Because the adhesive layer 55 is a conductive adhesive, an electrical connection between the solder balls 40 and the stiffener 14 is thus provided. Therefore, the stiffener 15 may be utilized as another conductor layer, preferably for use as a ground plane.

A design such as shown in FIG. 2, however, also has numerous disadvantages. For example, conductive adhesives (such as a conductive epoxy) are very expensive and the design of FIG. 2 utilizes a relatively large amount of such adhesive. Moreover, such conductive adhesives do not provide adequate adhesive and conduction properties due to their brittleness and high flow characteristics. Moreover, as with the design shown in FIG. 1, an end user's circuit design must match the placement of the ground solder balls 40, thus limiting the flexibility of use of the package 60.

Thus, it would be desirable to provide a TBGA package design which provides improved costs, reliability, and end user flexibility.

SUMMARY OF THE INVENTION

A ball grid array (BGA) package is provided in which the stiffener of the BGA may also be utilized as a conductive layer. A TAB tape is adhered to the stiffener by an adhesive and both the TAB tape and the adhesive may have vias which open to the stiffener. Conductive plugs which may be formed of solder paste, conductive adhesives, or the like may then be filled in the vias to provide electrical connection from the TAB tape to the stiffener. The vias may be located adjacent to solder ball locations. The TAB tape may include a multiple conductor layers or multiple layers of single conductive layer TAB tape may be stacked upon each other to provide additional circuit routing. Further, the TAB tape layers may also be combined with the use of metal foil layers.

In one embodiment of the invention a TAB tape is adhered to a stiffener to form a TBGA package. The TAB tape includes vias through the tape such that at least one conductor layer of the tape may make electrical contact to the stiffener. The vias through which electrical contact between the TAB tape and stiffener is obtained are offset from the solder balls of the TBGA package. Thus, the vias to the stiffener may be filled with a conductive material independent of a solder ball. Furthermore, the vias to the stiffener need not be filled in which case a solder ball electrically connected to a non-filled via would not necessarily be electrically connected to the stiffener. Thus, the stiffener may be utilized as a ground plane (or other plane such as a power plane) and multiple access points to form an electrical connection between the solder balls and the plane may be provided, yet each of the solder balls connected to those access points need not be tied to the ground plane. Thus, user selectability as to which solder balls would be connected to the ground plane is provided and those solder balls which are not connected to the ground plane may be utilized for connecting to other circuit signals.

The vias between the TAB tape and the stiffener may be filled with a variety of conductive materials to provide an electrical connection between the stiffener and the TAB tape layer exposed at the via. For example, conductive materials such as conductive solder paste, conductive adhesives, or conductive epoxies may be utilized.

In one embodiment a packae for an integrated circuit is provided in which the package includes a conductive stiffener, a conductive circuit layer attached to the stiffener, a plurality of solder ball bond sites within the circuit layer, and at least one via electrically coupled to at least one of the solder ball bond sites. The via may offset from the solder ball bond sites and formed to allow electrical coupling of the conductive circuit layer and the conductive stiffener.

In another embodiment, a TBGA package for electrically connecting an integrated circuit to a substrate is provided. The package may include a stiffener, a flexible circuit attached to the stiffener. The flexible circuit may include at least one dielectric layer and at least one conductor layer. The package may further include an adhesive layer for attaching the flexible circuit to the stiffener and a plurality of solder ball bond sites located on the flexible circuit. At least one via may be formed both in the flexible circuit and the adhesive layer at a location other than a solder ball bond site to provide a path through which electrical coupling of the stiffener and the flexible circuit may be accomplished.

In another embodiment of the present invention, an electrical package for mounting on a substrate is provided. The package may include an integrated circuit and a ball grid array package. The integrated circuit may be attached to the ball grid array package and electrical bonds may electrically couple the integrated circuit and the ball grid array package. The ball grid array package may include a conductive stiffener used as an electrical plane, a TAB tape attached to the stiffener, a plurality of solder balls electrically coupled to the TAB tape, and at least one conductive plug electrically coupling the TAB tape to the conductive stiffener wherein the conductive plug is horizontally offset from the solder balls.

The present invention also includes methods for forming an electrical package. One method includes providing a conductive stiffener, attaching a flexible circuit to the stiffener, providing solder ball bond sites in the flexible circuit and forming at least one via for electrically coupling the stiffener and the flexible circuit. The via may be formed so that the electrical coupling may be independent of the placement of solder balls on the bond sites and selectively accomplished after the attaching step. Another method is directed towards forming a TBGA package. This method includes providing a conductive stiffener, attaching a TAB tape to the stiffener, forming bond sites in the TAB tape for receiving a solder ball, and electrically coupling a via to at least one of the bond sites. The vias may provide a selectable electrical connection path between the TAB tape and the conductive stiffener and may be selectively fillable independent of the placement of the solder balls on the bond sites such that a solder ball electrically coupled to the via may be electrically decoupled from the conductive stiffener.

BRIEF DESCRIPTION OF THE DRAWINGS

FIG. 4b is a cross-sectional representation of the embodiment of FIG. 4a.

FIGS. 6 and 6a are cross-sectional representations of one embodiment of a method of forming conductive plugs according to the present invention.

FIGS. 7, 7a, and 7b are cross-sectional representations of TBGA packages utilizing multiple TAB tapes according to the present invention.

FIGS. 8 and 8a are a cross-sectional representation of a TBGA package utilizing one TAB tape and multiple layers of metal foil according to one embodiment of the present invention.

DESCRIPTION OF ILLUSTRATIVE EMBODIMENTS

Figure 1:
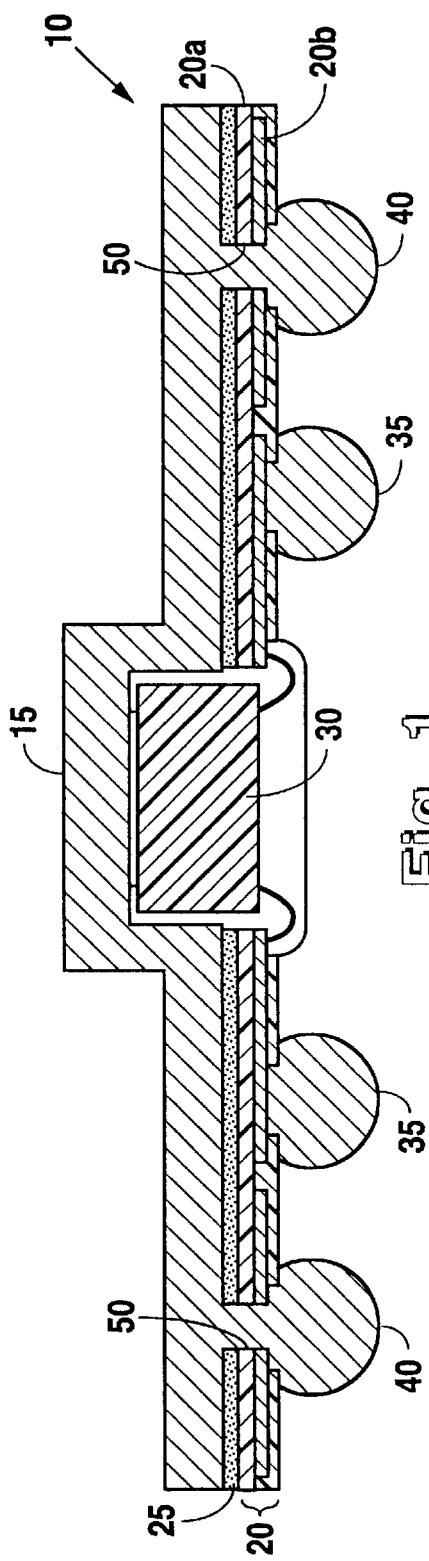
FIG. 1 is a cross-sectional representation of a conventional TBGA package of the prior art.
Figure 2:
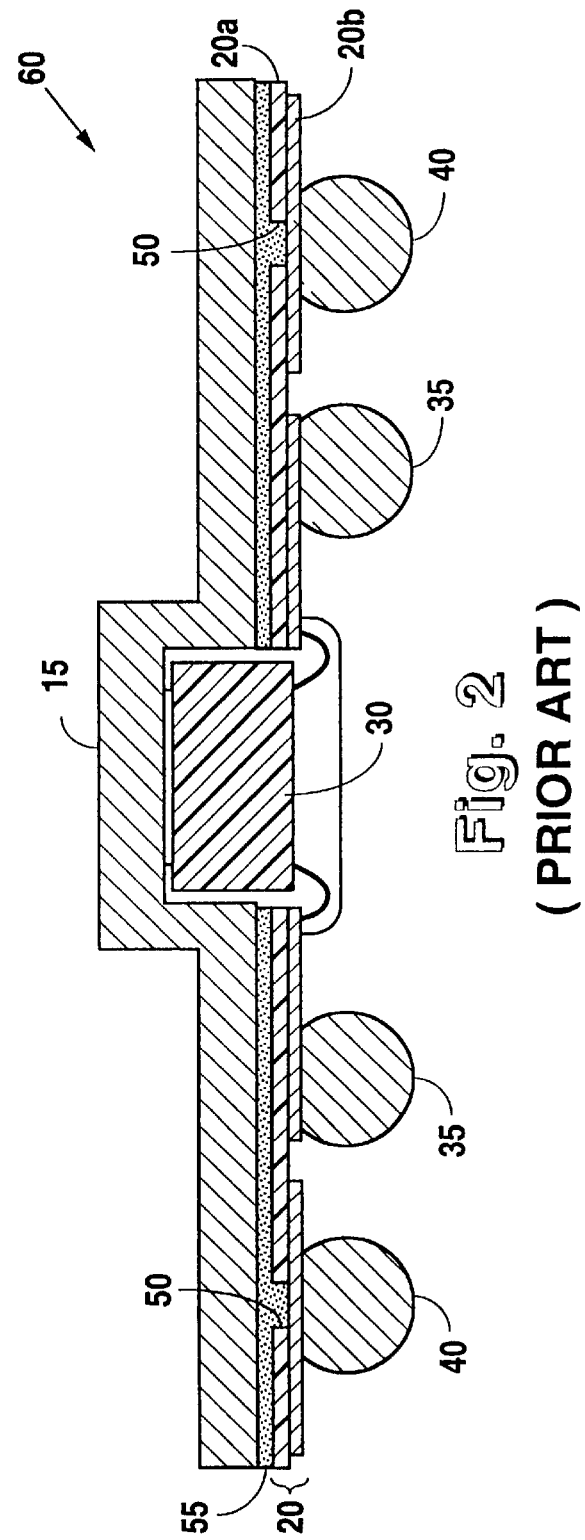
FIG. 2 is a cross-sectional representation of another conventional TBGA package of the prior art.
Figure 3:
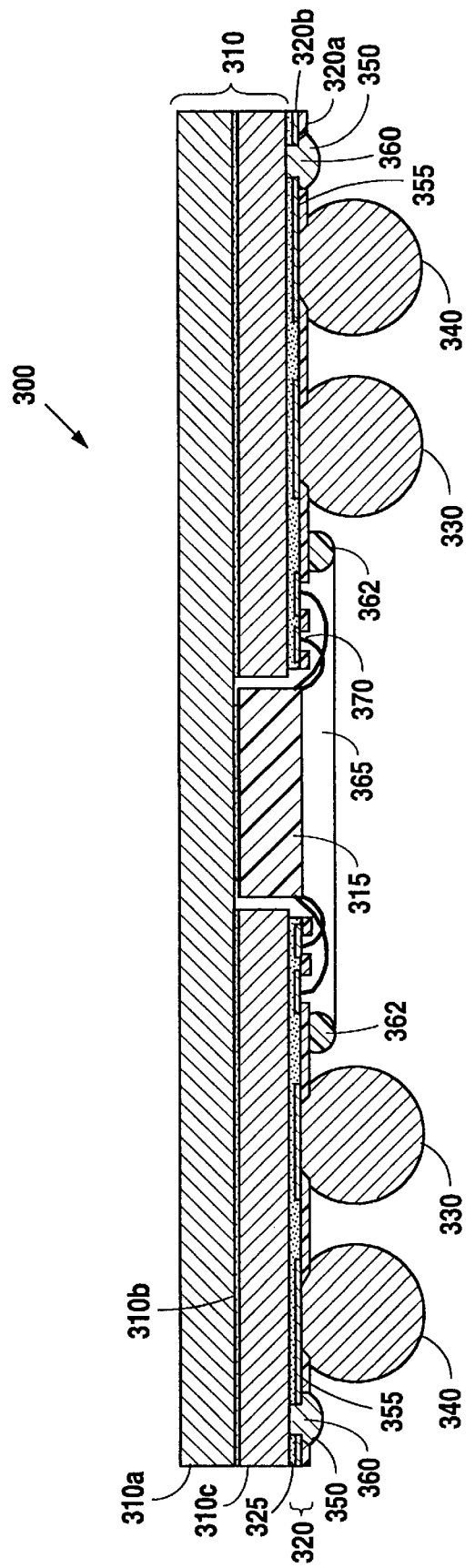
FIG. 3 is a cross-sectional representation of a TBGA package according to one embodiment of the present invention.

A TBGA package 300 configured according to the present invention is shown in FIG. 3. As illustrated in FIG. 3, a stiffener 310 is provided. The stiffener 310 may act as a BGA substrate to provide rigidity to the TBGA package 300 and also may act as a heatsink to dissipate heat from the integrated circuit 315. As shown in FIG. 3, the stiffener 310 may be comprised of two stiffener layers, 310a and 310c which are bound together with the use of an adhesive layer 310b. Alternatively, the stiffener 310 may be formed as a unitary piece such as shown in FIGS. 1 and 2. In yet another alternative, the integrated circuit 315 may be held in the TBGA package 300 through the use of flip chip bonding directly to a TAB tape (which extends completely across the stiffener cavity) and in which case the stiffener layer 310a may not be required.

A two-layer TAB tape 320 is adhered to the stiffener through the use of an adhesive layer 325. The TAB tape 320 may include a dielectric layer 320a and a conductive layer 320b. The integrated circuit may be bonded to the TAB tape 320 through the use of wire bonds as shown in FIG. 3 or alternatively through the use of inner lead bonds. An encapsulant 365 may then be provided over the bonding area. Encapsulant dams 362 may be provided so as to confine the encapsulant 365 within the bonding area. Solder balls 330 are electrically connected to the conductor layer 320b and traces (not shown) of the conductor layer 320b are provided from the solder balls to bonding sites 370 of the conductor layer 320b. Thus, electrical interconnection from a substrate such as a printed circuit board may be made through the solder balls 330 to the integrated circuit 315. Solder balls 340 also provide electrical connection to the conductor layer 320b of the TAB tape 320. As with the solder balls 330, conductor traces (not shown) of the conductor layer 320b may provide electrical connection from the solder ball 340 to the bonding sites 370 of the conductor layer 320b. Furthermore, conductive traces 355 of the conductor layer 320b are provided from the solder ball bond pad to via regions 360. Via regions 360 are regions in which a via or hole extends through the dielectric layer 320a and the conductor layer 320b. Furthermore in the via regions 360, a via is provided in the adhesive layer 325. By providing conductive traces 355 and vias 360, an electrical path may be formed from the solder balls 340 to the stiffener 310 by filling the vias 360 with a conductive plug 350.

Figure 4:
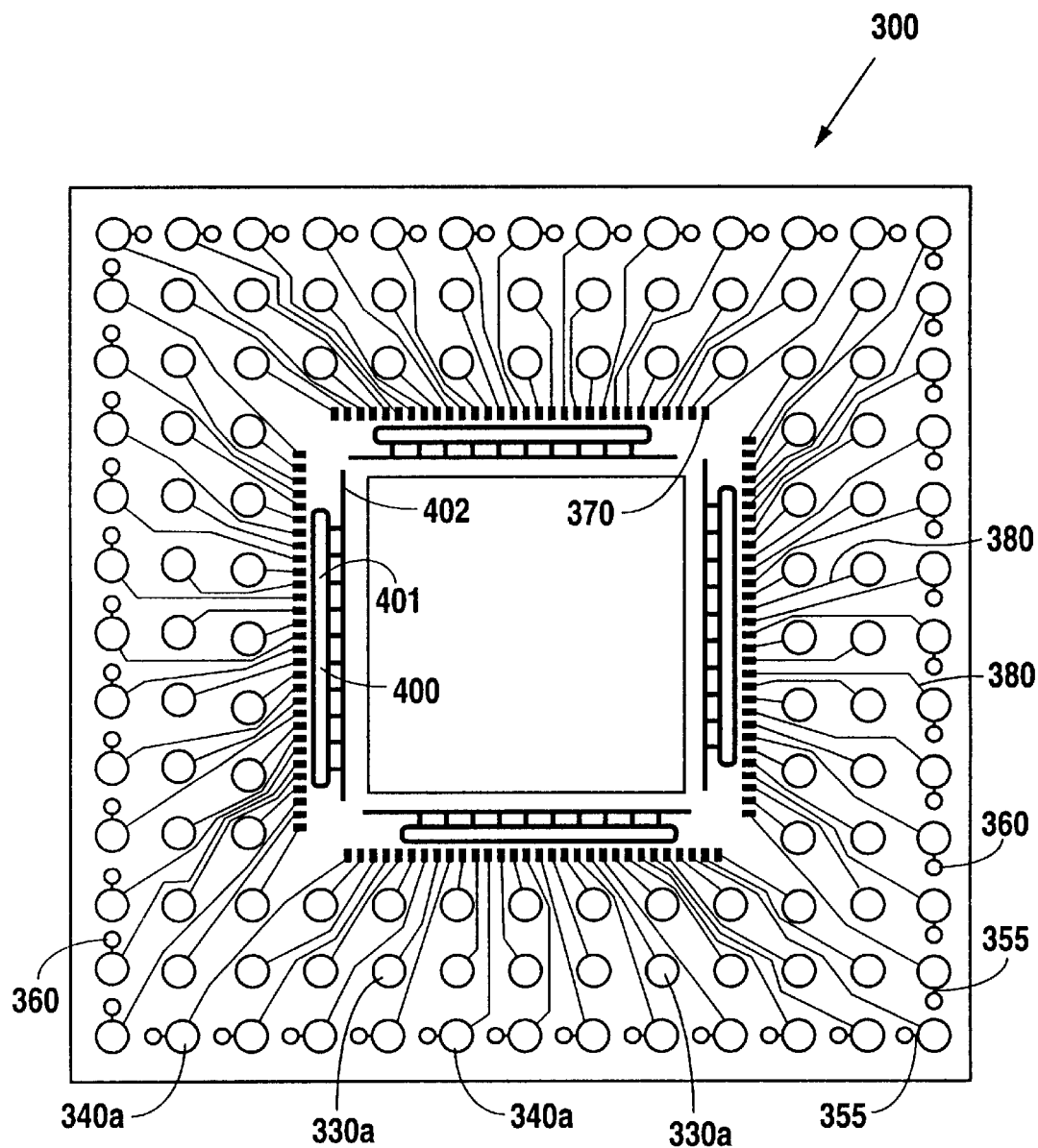
FIG. 4 is a plan view of a TBGA package according to one embodiment of the present invention.

FIG. 4 illustrates bottom view of a TBGA package similar to that described above with reference to FIG. 3. As shown in FIG. 4, a TBGA package 300 having an array of bonding sites and conductive traces in the conductor layer 320b of the TAB tape is provided. Bonding sites 330a and 340a are provided for the placement of solder balls 330 and 340 respectively. Conductive traces 380 extend from the solder ball bonding sites to the die wire bonding sites 370. It will be recognized that rather than wire bonding sites 370, the conductive traces 380 may alternatively extend to inner lead bond sites. The bonding sites 340a are connected to conductive traces 355 which extend from the bonding sites 340a to the vias 360. As discussed above, the vias at 360 may provide an opening through which a conductive plug 350 may be placed so as to electrically connect the bonding sites 340a (and the associated solder ball 340 with the stiffener 310).

Also shown in FIG. 4 is the use of ground bar regions 400. The ground bar regions 400 include a via region 401 and a bond site region 402. The bond site regions 402 provide a large area at which a wire bond may be attached between a ground pad of a integrated circuit to the TAB tape. The vias 401 are similar to the vias 360 in that they provide a via from the conductor layer 320b through the adhesive layer 325 so that electrical connection may be made to the stiffener 310 by providing a conductive plug within the via region 401. In this case, the conductive plug may be much larger in area than the conductive plugs utilized to fill the vias 360. Thus the ground bar regions 400 provide a large area in which multiple ground connections may be provided from the die to the TAB tape and also a large area in which the TAB tape ground connection may be connected to the stiffener. Such ground bars therefore provide a very low resistance and high reliable contact region for making ground connections. The resulting low inductance ground path is necessary for high speed die. Though described above with relation to ground connections it will be recognized that the bar regions 400 may also be utilized for connections to other planes such as power planes.

Figure 4A:
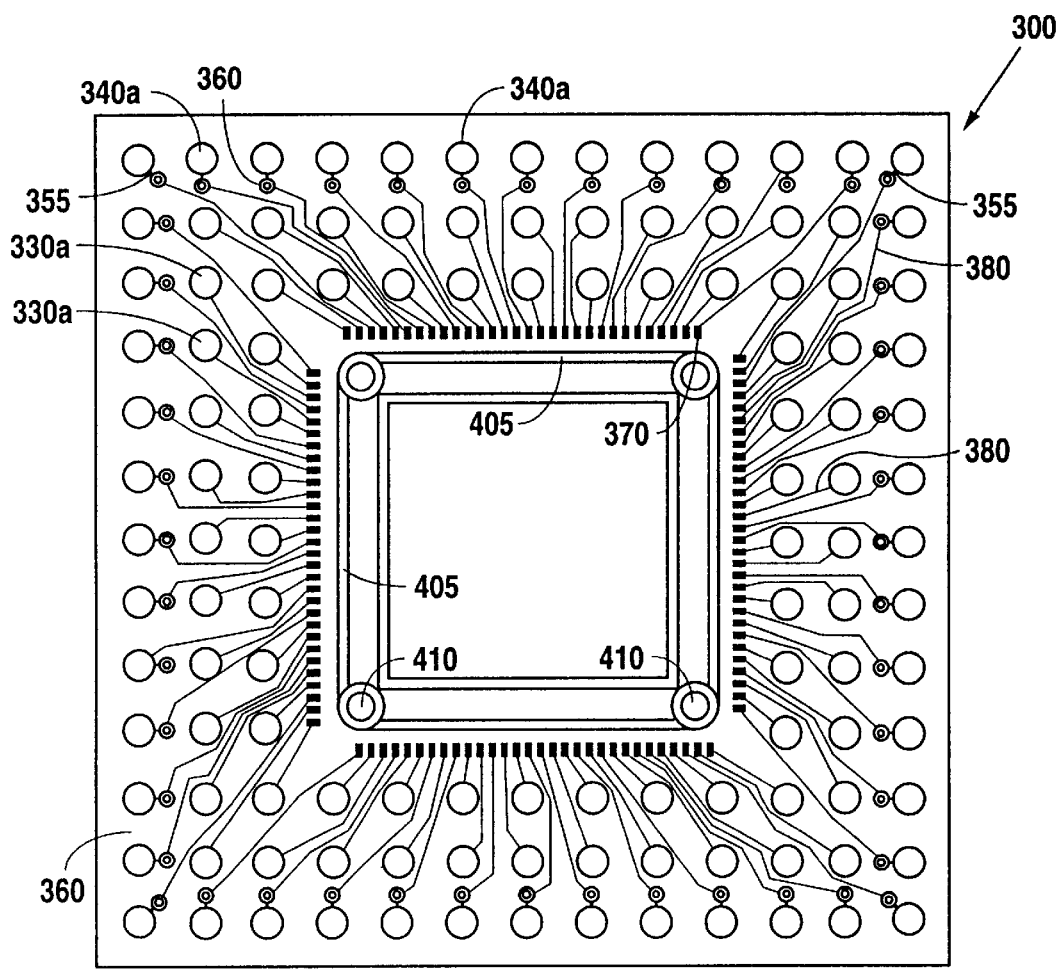
FIG. 4a is a plan view of a TBGA package according to one embodiment of the present invention.
Figure 4B:
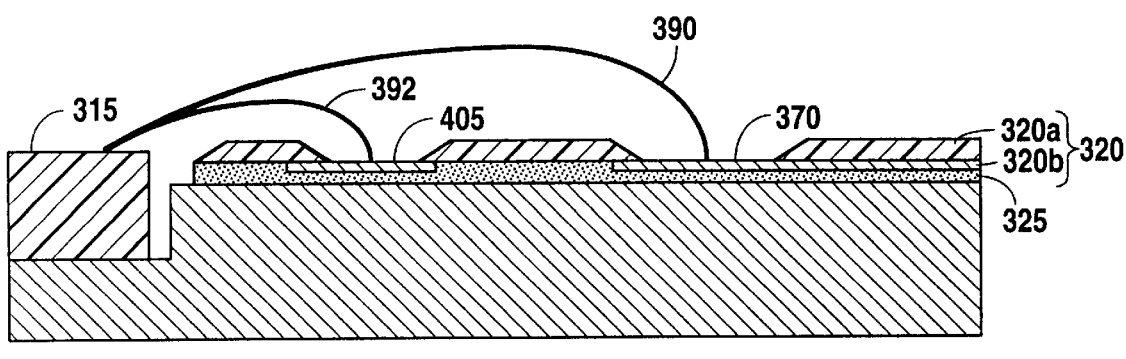

In a view similar to FIG. 4, FIG. 4a illustrates an alternate embodiment of a TBGA package according to the present invention. In FIG. 4a, the conductor layer 320b of the TAB tape 320 includes solder ball bond sites 330a and 340a, via regions 360, conductive traces 355 between the vias 360 and solder ball bond sites 330a, and conductive traces 380 which electrically connect the wire bond sites 370 to the solder ball bond sites 330a and 340a. The conductor layer 320b also includes a ground ring 405. The ground ring 405 also includes ground ring vias 410. As with vias 360, the ground ring vias 410 may be filled with a conductive plug so as to provide electrical connection to the stiffener. The ground ring 405 provides a convenient and accessible wire bond site for electrically connecting the integrated circuit 315 to the stiffener 310. FIG. 4b illustrates the wire bonding of the integrated circuit 315 to the ground ring 405 and the wire bond sites 370 of the TAB tape 320.

The use of conductor plugs as described herein provides a flexible TBGA package with which either the end user or the TBGA package manufacturer may selectively choose or program which solder balls will be utilized for connections to the stiffener such as for ground plane applications after the standard TBGA package has been assembled. The user's selection or programming of the electrical coupling of solder balls to the stiffener may be accomplished by merely filling or plugging the desired vias with a conductive material. Thus, though any of the solder balls 340 and bond pads 340a may be connectable to the stiffener, they need not be connected to the stiffener. As such, an end user may utilize some of the solder ball pads 340 for electrical signals which are not connected to the stiffener while utilizing other of the solder ball pads 340 for ground type connections to the stiffener. This provides significantly more flexibility to the end user than the methods described above with reference to the prior art.

Furthermore because the solder ball pads 340a are optionally connectable to the stiffener, these pads need not be dedicated for the connection to the stiffener. Thus, many of the optionally connectable solder ball locations may be provided throughout the circuit without necessarily losing signal connection locations, as those locations would not be dedicated to stiffener electrical connections. To improve reliability, a user may make as many connections to the stiffener as the integrated circuit pinout allows. Moreover, because the interconnect method and structure described herein does not affect the solder ball height, improved coplaniarity between all solder balls is provided. Further the material used to electrically connect to the stiffener need not be the same material as the solder ball and thus greater flexibility is also provided as to the solderability or adhesive characteristics required of the stiffener and the solder balls that are utilized to form the TBGA package. In addition, because only the vias need to be filled with the conductive plugs (rather than an entire layer), the amount of conductive material used for the plugs may be limited. Furthermore, since the material used to plug the vias does not make contact to the circuit board, thermal mismatch stresses between the packages and the board will not affect the reliability of the ground connection.

It will be recognized that a wide range of materials, compositions, and geometric shapes and sizes may be utilized for the various components of the TBGA package 300 while still obtaining the benefits of the present invention. In one embodiment, the stiffener 310 may be formed from a conductive material. For example, stiffener layer 310c may be formed partially or completely of copper, stainless steel, aluminum, copper alloy 194, 304 stainless steel, alloy 42, or alloys thereof. The stiffener layer 310c may have a thickness of about 5 mils to 30 mils and preferably between 9 mils and 16 mils. To obtain improved contact resistance characteristics, the stiffener layer 310c may be coated with a thin plating of nickel, nickel/boron, black copper oxide, tin/lead (such as a high lead content tin/lead alloy of over 37% lead) or precious metals. Such a coating, however, is not required. The stiffener layer 310a may be formed from the same materials and of the same thicknesses as the layer 310c. Alternatively, the stiffener layer 310a is not required to be a conductive material and other materials may be utilized, preferably those with good heatsink characteristics. The adhesive layer 310b may be formed of any adhesive which may bond the layers 310c and 310a together including a conductive adhesive. For example, a strip adhesive formed of thermoplastic polyimide, epoxy, or polyolifin may be utilized. In one embodiment, a polyimide layer of 1 mils to about 3 mils may be utilized. As described above, stiffener 310 may alternatively be formed as a unitary structure in which case the stiffener would be formed from materials such as utilized for layer 310c.

The TAB tape 320 may be formed from any of a variety of flexible circuit tape, flex circuit, or TAB tape as known in the art. The conductor layer 320b may be comprised of any patternable conductive material suitable for forming substantially planar circuitry including, but not limited to, metals or conductors such as silicon and polysilicon, tungsten, titanium, conductive adhesives, aluminum, aluminum based metals (such as aluminum alloys), copper, and alloys and combinations thereof, etc. Most typically, conductor layer 320b is copper. The dielectric layer 320a may be comprised of any patternable dielectric material suitable for insulating conductor layer 320b including, but not limited to polyimide or polyester. Most typically dielectric layer 320a is a polyimide, such as "DUPONT KAPTON" or "UBE UPILEX". The conductor layer 320b typically has a thickness of between about 0.2 mils to about 2 mils, more typically from about 0.7 mils to about 1.4 mils. The dielectric layer 320a typically has a thickness of between about 1 mil to about 4 mils, more typically from about 2 mils to about 3 mils.

The TAB tape 320 may be attached to the stiffener 310 by any of a variety of adhesives. For example, adhesive layer 325 may be a strip adhesive formed of polyimide, epoxy, or polyolitin. One such example of adhesive is DuPont KJ. A typical thickness for the adhesive layer 325 may be about 1 mil to about 4 mils and more preferably from about 2 mils to about 3 mils.

Solder balls 340 and 330 may be any shape and dimension suitable for making connection to the conductor layer 320b through vias in the dielectric layer 320a. Typically, solder balls 340 and 333 are substantially spherical in shape and have a diameter of from about 10 mils to about 30 mils, most typically between about 20 mils and about 30 mils.

The vias 360 may be any shape or size which provides sufficient electrical contact between the TAB tape 320 and the stiffener 310 when the vias are filled with a conductive plug. For example, the vias may be circular in shape. The diameter of the vias in the dielectric layer 320a may typically vary from 4 mils to 30 mils, the diameter of the conductor layer via may be 2 to 12 mils smaller than the opening in the dielectric layer, and the diameter of the adhesive layer may be 4 to 12 mils larger than the conductor layer opening. For example, in one embodiment the vias 360 have diameters of 25 mils at the dielectric layer 320a, 20 mils at the conductor layer 320b and 28 mils at the adhesive layer 28. The conductive plugs 350 which fill the vias 360 may be formed from a wide variety of materials. Such materials may include solder paste, conductive adhesives, conductive epoxies, or copper pastes. For example, solder paste such as 63Sn37Pb or 10Sn90Pb may be utilized and conductive adhesives or epoxies such as silver filled epoxy may be utilized. In one embodiment, 10Sn90Pb solder paste is utilized. It is desirable that the conductive plug material be any conductive material that has a higher melting temperature than that of the solder balls so that the plug material does not melt during the bonding of the TBGA package to the circuit board.

The encapsulant 365 may be any material that provides an environmental seal over the bonding area of the die and TAB tape. For example, the encapsulant may be epoxy or silicone. The encapsulant dams may be formed of high viscosity epoxy or a strip of polyimide tape and may have a height of about 4 mils to 12 mils to hold the encapsulant within the bonding area. Alternatively, a suitably thick encapsulant may be utilized such that encapsulant dams 362 are not required.

The TBGA package 330 may be manufactured in a wide range of manners. For example, the TAB tape 320 may be patterned by chemical milling or etching the dielectric layer and plating a patterned conductor layer to the dielectric layer. Then the patterned TAB tape may be aligned and adhered to a patterned adhesive layer 325 (the adhesive layer may be patterned by mechanically punching the vias). Then the adhesive layer may be attached to the stiffener. In another method, a TAB tape having vias may be adhered to the stiffener with an adhesive layer which does not have the via patterning. After the TAB tape is adhered to the stiffener, the via may be formed in the adhesive through the use of laser ablation, chemical milling, or mechanical milling. In yet another alternative, a TAB tape and an adhesive layer, neither being patterned with vias, may be joined to the stiffener. Then, the vias may be formed in both the TAB tape and adhesive layer through any acceptable method such as laser ablation, chemical milling or mechanical milling.

Figure 5:
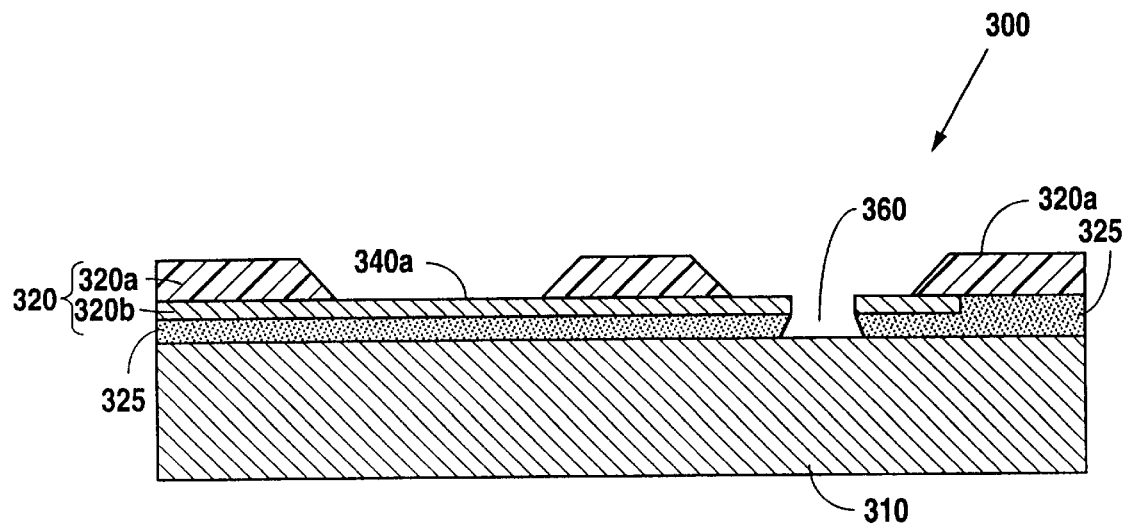
FIGS. 5 and 5a are expanded cross-sectional representations of a TBGA package utilizing conductive plugs according to the present invention.
Figure 5A:
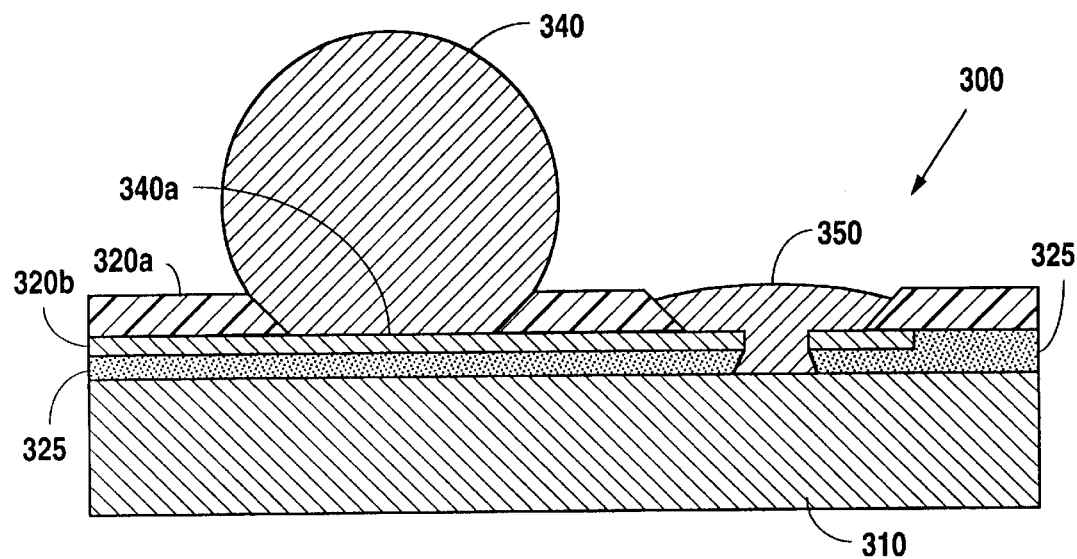

An expanded view of the TBGA package 300 showing the vias after formation is shown in FIGS. 5 and 5a. As shown in FIG. 5, the TAB tape 320 has conductor layers 320b and a dielectric layer 320a adhered to the stiffener 310 through an adhesive 325. The via 360 extends through the TAB tape 320 and the adhesive layer 325. A bonding site 340a is provided, at which point a solder ball 340 may be placed. To complete the electrical connection from the solder ball 340 to the stiffener 310, a conductive plug 350 is provided in the via region 360.

The conductive plugs 350 may be formed either before or after the placement of the solder balls 340. The plugs may be deposited in the vias through the use of a liquid dispensing machine which may drop the paste, adhesive, or epoxy in the appropriate vias. Alternatively a stencil or mask approach may also be utilized for the filling of the vias. A mask approach for forming the conductive plugs 350 is shown in FIGS. 6 and 6a. As shown in FIG. 6, a mask 600 made of a material such as a stencil or screen as commonly used in the industry may be placed over the TAB tape after the TAB tape is adhered to the stiffener 310. The mask 600 contains open regions 610 in the locations where it is desired to form the conductive plugs 350. The conductive plug material is then filled in the via regions 360. Subsequently the mask may be removed leaving the conductor plugs. The solder balls 340 may be applied as shown in FIG. 6a.

In the embodiments above, the TAB tape 320 is a two layer TAB tape having a single conductor layer. In a two-layer TAB tape, both layers 320a and 320b are outer layers of the tape. Alternatively a three or more layer tape having one, two or more conductor layers may also be utilized.

In yet another embodiment, multiple conductor layers may be obtained by adhering one or more two layer TAB tapes together. FIG. 7 illustrates an embodiment in which three two layer TAB tapes, TAB tape 700, TAB tape 710, and TAB tape 720 are all adhered to each other by adhesive layers 725. An adhesive layer 325 attaches the multi-tape stack to the stiffener 310. Each of the TAB tape includes a single polyimide layer and a single conductor layer such as dielectric layer 720a and conductor layer 720b. An adhesive is provided between each TAB tape so as to generate the stacked TAB tape structure 730 shown in FIG. 7. Each of the TAB tapes 700, 710, and 720 may be patterned to form vias as discussed above with reference to the single TAB tape embodiment. As shown in FIG. 7, the vias may extend between one or more of the TAB tapes. For example, a via 740 provides a via between the TAB tape 720 and the TAB tape 710. Likewise, a via 741 provides an opening so that the conductor layer of TAB tape 700 is exposed and via 742 provides a via opening which exposes the stiffener 310. As with the single tape embodiment discussed above, conductive plugs may then be placed within the vias as shown in FIG. 7a. FIG. 7a illustrates a conductive plug 750 which connects the conductor layers of the TAB tape 720 and the TAB tape 710. Conductive plug 751 provides an electrical connection between the TAB tape 720 and the TAB tape 700. Finally, conductor plug 752 provides an electrical connection between the TAB tape 720 and the stiffener 310. It will be recognized that a wide variety of combinations of connections between the TAB tapes and/or stiffener may then be accomplished through the use of vias and conductive plugs. Thus, the specific connections shown herein are used for illustrative purposes only and the concept of utilizing conductive plugs to electrically connect multiple TAB tape layers and/or the stiffener may be utilized to achieve various electrical connections.

Figure 7B:
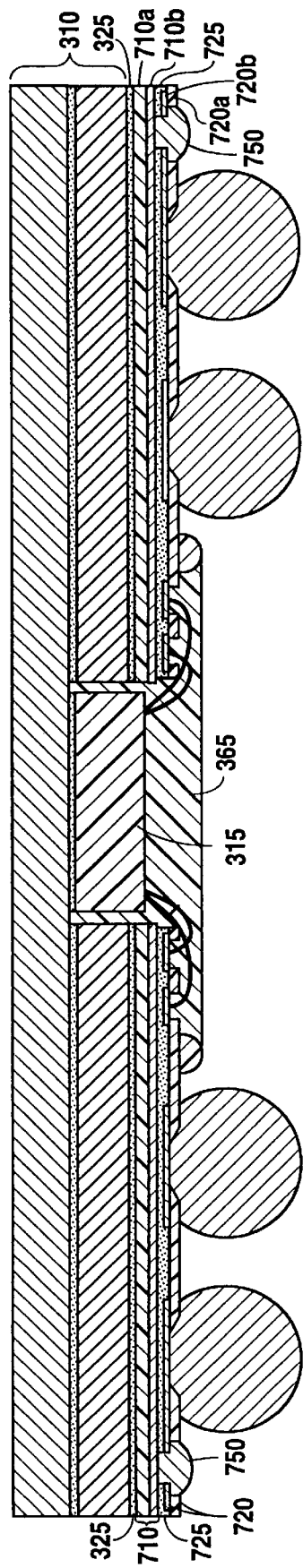

FIG. 7b illustrates another multi TAB tape embodiment of the present invention. In FIG. 7b, two two-layer TAB tapes 710 and 720 are provided. An adhesive layer 725 adheres the two TAB tapes together. An adhesive layer 325 adheres the TAB tapes to the stiffener 310. The TAB tape 720 includes a dielectric layer 720a and conductor layer 720b. The TAB tape 710 includes dielectric layer 710a and conductor layer 710b. As can be seen in FIG. 7b, the TAB tapes 720 and 710 are arranged such that the two conductor layers 710b and 720b face each other with the adhesive layer 725 formed between the conductor layers. A conductive plug 750 fills a via that is formed through dielectric layer 720a, conductor layer 720b, and adhesive layer 725. It will be noted that in this manner conductive plug 750 provides electric contact between conductor layers 720b and 710a. Though not shown, the TBGA package of FIG. 7b may also utilize vias that extend through TAB tape 710 so that the stiffener 310 may also act as an electrical plane.

FIGS. 8 and 8a illustrate yet another embodiment of the use of the conductive plugs in a TBGA package having multiple conductor layers in addition to a conductive stiffener. The embodiment demonstrated in FIG. 8 is similar to that shown in FIGS. 7 and 7a except rather than using multiple TAB tapes, one two layer TAB tape 820 is utilized and multiple metal sheets or foil layers such as metal layers 830 and 840 are provided. As shown in FIG. 8, the TAB tape layer 820, the metal foil layer 830, the metal foil layer 840, and the stiffener 310 are adhered together by three adhesive layers 825, 835, and 845. Vias 740, 741, and 742 may then be formed in the multi-layer stack 815 similar to the vias described with reference to FIG. 7a. Finally, conductor plugs 750, 751, and 752 may then be used to fill the vias as shown in FIG. 8a.

Prior to laminating the metal foil layers together, the metal foil layers may be pre-patterned and coated from one side (the side that will not be used with bond with a conductive plug) with a thin insulating polymer film 850 which coats the inside of each of the pre-punched holes in the foil. Following this, a thin layer adhesive may be deposited over the polymer coating and then the foil stacked and laminated to the stiffener with the appropriate holes aligned to allow interconnection between the desired layers. The polymer coating 850 on the inside of the holes in the metal foil layer may prevent undesirable shorting to the center layers. For example as shown in FIGS. 8 and 8a, when via 742 is ultimately filled the conductor of TAB tape 820 will electrically connect to the stiffener but the polymer film 850 will prevent electrical connection between the plug and layers 830 and 840 in that via.

Thus, the conductive plugs may be utilized in a variety of multiple conductive layered arrangements which may provide greater circuit routing and density. As shown in FIGS. 7, 7a, 8, and 8a, the conductive plugs may be utilized to connect a variety of the conductor layers to each other and/or to the stiffener. Furthermore, solder balls may be associated with some of the conductive plugs, however some of the conductive plugs may not be adjacent a specific solder ball, but rather, the conductive plug may merely be used for routing a signal from one layer to another. The TAB tapes for use in the embodiments shown in FIGS. 7–8 may be similar to that as shown in FIGS. 3 and 4. The metal sheet layers 830 and 840 may be unpatterned metal sheet layers (typically for use as ground or power planes) or may be patterned with a desired circuit pattern. Suitable metal sheets include but are not limited to metal foils made of copper, stainless steel, alloy 42, tungsten, titanium, stainless steel, aluminum, aluminum based metals (such as aluminum alloys), and alloys and combinations thereof, etc. In one embodiment copper foil is coated with a thin plated metal to provide good solderability, low cost, and/or reduced oxidation characteristics. Examples of suitable coatings include, but are not limited to, a surface coating of plated nickel, nickel/boron, black copper oxide, tin/lead (such as a high lead content tin/lead alloy of over bout 37% lead) or precious metals. Most typically, a metal sheet is a copper foil having a thickness of between about 1 mil and about 10 mils, more typically between about 2 mils and about 6 mils and a nickel/iboron coating of about 0.5 microns to about 3 microns.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed structures and methods may be utilized in various combinations and/or independently. Thus the invention is not limited to only those combinations shown herein, but rather may include other combinations.

What is claimed is:

1. A package for an integrated circuit, comprising:

a conductive stiffener;

a conductive circuit layer attached to said stiffener;

a plurality of solder ball bond sites within said circuit layer;

a plurality of solder balls electrically coupled to said plurality of solder ball bond sites;

at least one via electrically coupled to at least one of said solder ball bond sites, said via being offset from said solder ball bond sites, said via formed to allow electrical coupling of said conductive circuit layer and said conductive stiffener; and a conductive plug within said via, said conductive plug electrically coupling said circuit layer and said conductive stiffener, said solder balls and said conductive plug having relative heights such that said solder balls may be attached to a substrate without said conductive plug touching said substrate.

2. The package of claim 1, said conductive stiffener forming an electrical plane.

3. The package of claim 1, further comprising:

an adhesive layer between said conductive stiffener and said circuit layer, said via being formed in said adhesive layer and said circuit layer.

4. The package of claim 3 further comprising:

said conductive plug extending from at least said stiffener to said circuit layer.

5. A TBGA package for electrically connecting an integrated circuit to a substrate, said package comprising:

a conductive stiffener;

a flexible circuit attached to said stiffener, said flexible circuit including at least one dielectric layer and at least one conductor layer;

an adhesive layer for attaching said flexible circuit to said stiffener;

a plurality of solder ball bond sites located on said flexible circuit;

a plurality of solder balls electrically coupled to said plurality of solder ball bond sites;

a via formed in said flexible circuit and said adhesive layer, said via formed at a location other than said solder ball bond sites and providing a path through which electrical coupling of said stiffener and said flexible circuit may be accomplished; and a conductive plug within said via, said solder balls and said conductive plug having relative heights such that said solder balls may be attached to said substrate without said conductive plug touching said substrate.

6. The TBGA package of claim 5, further comprising a plurality of vias formed in said flexible circuit and said adhesive layer, said plurality of vias being selectably fillable with said conductive plug.

7. The TBGA package of claim 6, said conductive layer of said flexible circuit facing said stiffener.

8. An electronic package for attachment to a substrate, comprising:

an integrated circuit; and a ball grid array package, said integrated circuit attached to said ball grid array package, said integrated circuit and said ball grid array package electrically coupled to each other, said ball grid array package comprising, a conductive stiffener forming an electrical plane, a TAB tape attached to said stiffener, a plurality of solder balls electrically coupled to said TAB tape, and at least one conductive plug electrically coupling said TAB tape to said conductive stiffener, said conductive plug being horizontally offset from said solder balls;

wherein said solder balls and said at least one conductive plug have relative heights such that said solder balls may be attached to said substrate without said at least one conductive plug touching said substrate.

9. The package of claim 8, further comprising:

a plurality of vias electrically coupled to said solder balls, said vias being selectably fillable such that said solder balls coupled to said vias may optionally be electrically coupled to said conductive stiffener.

10. The package of claim 9, said TAB tape including at least one conductor layer and at least one dielectric layer, said conductor layer being an outer layer facing said conductive stiffener.

* * * * *